United States Patent [19]
Senderowicz et al.

[11] Patent Number: 5,287,106
[45] Date of Patent: Feb. 15, 1994

[54] CIRCUIT FOR PCM CONVERSION OF AN ANALOG SIGNAL, WITH IMPROVEMENT IN GAIN-TRACKING

[75] Inventors: Daniel Senderowicz, Berkeley, Calif.; Germano Nicollini, Piacenza, Italy; Carlo Crippa, Merate, Italy; Pierangelo Confalonieri, Canonica D'Adda, Italy

[73] Assignee: SGS-Thomson Microelectronics spa, Catania, Italy

[21] Appl. No.: 187,507

[22] Filed: Apr. 28, 1988

[30] Foreign Application Priority Data

May 7, 1987 [IT]  Italy .................. 20421 A/87

[51] Int. Cl.[5] .............. H03M 1/06; H03M 3/04; H03M 1/00
[52] U.S. Cl. ........................ 341/118; 341/143; 341/155
[58] Field of Search ............ 341/143, 126, 139, 110, 341/118, 125, 131, 61, 155; 375/25, 26, 34, 33

[56] References Cited

U.S. PATENT DOCUMENTS

| | | | |
|---|---|---|---|
| 3,937,897 | 2/1976 | Song ........................... | 341/75 |
| 4,035,724 | 7/1977 | Stephenne et al. .......... | 341/61 |
| 4,044,306 | 8/1977 | Villeret et al. ............... | 341/61 |
| 4,071,842 | 1/1978 | Tewksbury .................. | 341/143 |
| 4,075,655 | 2/1978 | Iijima et al. ................. | 375/33 |
| 4,109,110 | 8/1978 | Gingell ....................... | 341/61 |
| 4,150,367 | 4/1979 | Svala .......................... | 341/125 |
| 4,288,873 | 9/1981 | Gingell ....................... | 341/118 |
| 4,509,037 | 4/1985 | Harris ......................... | 341/77 |
| 4,594,575 | 6/1986 | Avery et al. ................. | 341/131 |
| 4,860,012 | 8/1989 | Rich et al. .................. | 341/110 |
| 4,875,045 | 10/1989 | Lynch et al. ................ | 341/131 |
| 4,899,155 | 2/1990 | Jackson ...................... | 341/155 |

OTHER PUBLICATIONS

1986 IEEE International Solid-State Circuits Conference, New York, Feb. 20, 1986, pp. 180-181, IEEE, New York, U.S.; K. Yamakido et al.: "A Voice 15b Interpolative Converter Chip Set".

IEEE Journal of Solid-State Circuits, vol. SC-15, No. 6, Dec. 1980, pp. 1014-1021, IEEE, New York, U.S.; H. Kuwahara et al.: "An Interpolative PCM CODEC with Multiplexed Digital Filters".

Electronic Components & Appl., vol. 2, No. 4, Aug. 1980, pp. 242-250 Eindhoven, NL; D. J. G. Janssen et al.: "PCM Coden with On-Chip Digital Filters".

1987 IEEE International Symposium on Circuits and Systems, Philadelphia, Pa., May 4th-7th, 1987, pp. 467-472, IEEE, New York, U.S.; A. Yukawa: "Constraints Analysis for Oversampling A-to-D Converter Structures on VLSI Implementation".

"All-MOS Charge Redistribution Analog-to-Digital Conversion Techniques-Part 1" by James L. McCreary and Paul R. Gray, published in the IEEE Journal of Solid State Circuits, vol. SC-10, No. 6, Dec. 1975, pp. 371-179.

Primary Examiner—Sharon D. Logan
Attorney, Agent, or Firm—Wolf, Greenfield & Sacks

[57] ABSTRACT

The circuit includes a filter to which an analog signal is applied, a quantizer driven by the filter, a sampler at a desired frequency driven by the quantizer and a PCM encoder driven by the sampler. The quantizer generates a quantize signal according to the received analog signal and further generates a difference signal according to the difference between a quantized signal and the analog signal. A feedback circuit feeds back the difference signal from the quantizer to a stage of the filter so that the overall transfer function from the input of the feedback circuit to the output of the filter is equivalent to a low pass filtering.

20 Claims, 3 Drawing Sheets

CIRCUIT FOR PCM CONVERSION OF AN ANALOG SIGNAL, WITH IMPROVEMENT IN GAIN-TRACKING

BACKGROUND OF THE INVENTION

1. Field of the Invention

The present invention relates to a circuit for PCM conversion of an analog signal, such as a voice signal, with improvement of gain-tracking.

2. Prior Art

In recent years PCM (Pulse Code Modulation) coding has become very widespread, until it has become the modulation method most used in telephone systems. Among the various international recommendations (such as CCITT in Europe) which set rules on every possible telephone connection, those related to the PCM converter (normally constituted by an integrated circuit known as "Combochip") prescribe, among other things, a mask (described hereinafter) for limiting the gain error (i.e. gain-tracking) as the level of the input signal, assumed sinusoidal, varies.

Analog-digital conversion is performed with a quantizer which forces the analog signal to assume only preset discrete values, and with a sampler which samples the quantized signal and feeds the successive samples to an encoder. Since analog-digital conversion introduces, as is known, a quantization error in the signal to be encoded, this reflects in a corresponding error in the encoded signal, equivalent to a gain error, even for an ideal "combochip".

SUMMARY OF THE INVENTION

The aim of the invention is now to provide a PCM conversion circuit ("combochip") having a gain-tracking better than that of known circuits, and actually better than the one considered ideal.

The invention achieves the above described aim, as well as other objects and advantages which will become apparent hereinafter, with a circuit for PCM conversion of an analog circuit, comprising a filter to the input whereof the analog signal is applied, a quantizer driven by the filter, a sampler at a desired frequency driven by the quantizer and a PCM encoder driven by the sampler, characterized in that the circuit furthermore comprises circuit means for detecting the difference between the analog signal and the quantized one, and for injecting in feedback the difference in a stage of the filter in such a manner that the transfer function from the input of the circuit means to detect the difference at the output of the filter corresponds to a low-pass filtering.

BRIEF DESCRIPTION OF THE DRAWINGS

The invention is now described in greater detail with reference to a preferred embodiment thereof, illustrated in the accompanying drawings, wherein.

DETAILED DESCRIPTION OF THE PREFERRED EMBODIMENTS

Figure 1:
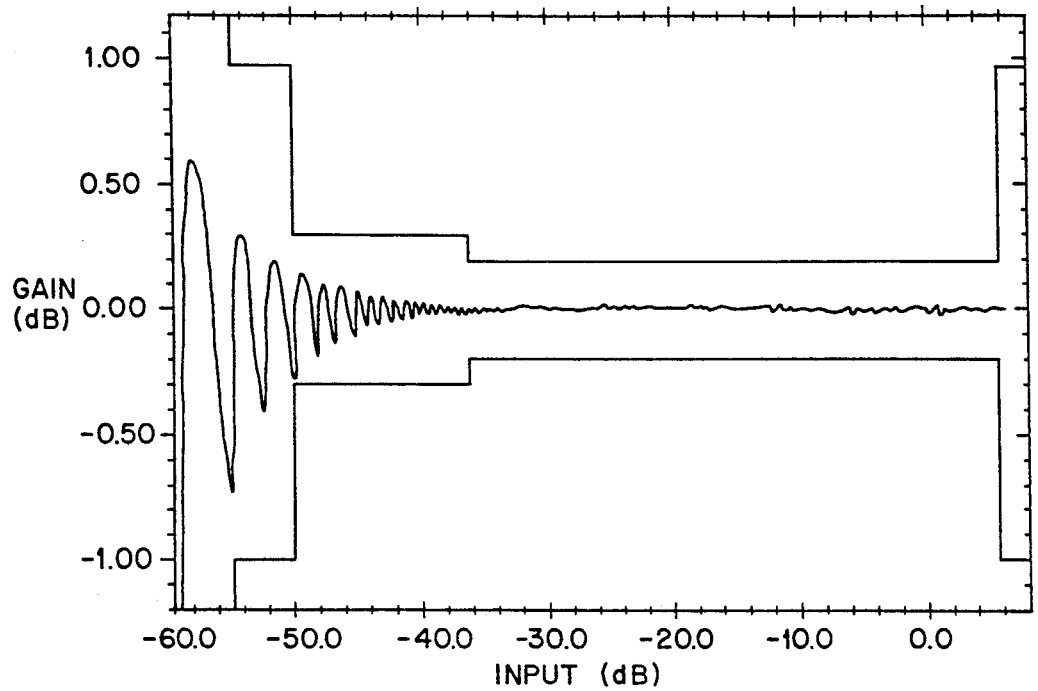
FIG. 1 is a diagram illustrating a mask for limiting the gain error and the ideal gain-tracking, according to the prior art.

In FIG. 1, which is a diagram of the variation in gain in dB as a function of the input signal level, also in dB, the two broken lines define a mask within which, according to CCITT recommendations, the gain variation curve must be comprised. The mask is referred to the gain at −10 dBmO, it assumes that the gain is measured when the sinusoidal input signal is equal to −10 dBmO as absolute reference.

Figure 2:
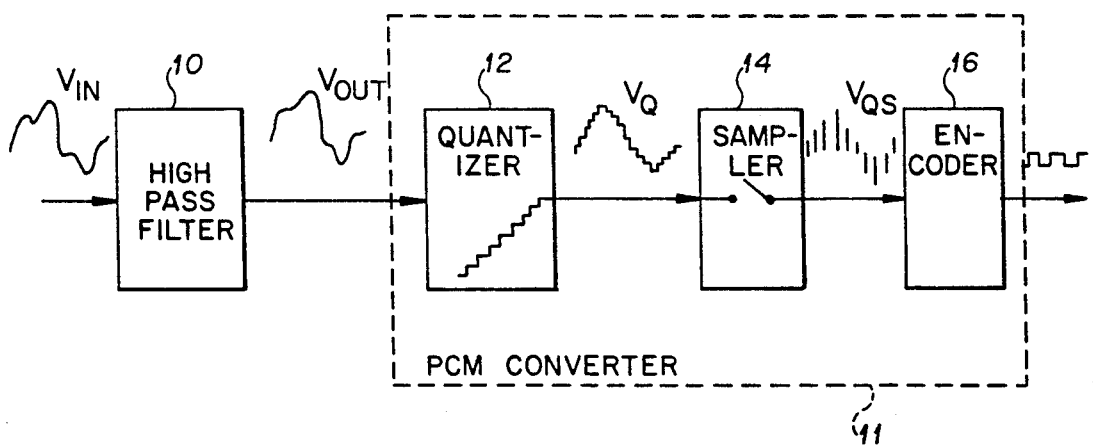
FIG. 2 is a block diagram of a PCM conversion circuit according to the prior art.

FIG. 2 illustrates a PCM conversion circuit according to the prior art. It comprises a high-pass filter 10 which receives an analog input signal $V_{in}$, typically a voice signal. It is assumed that the signal $V_{in}$ has been previously filtered in a low-pass filter, not illustrated, with cutoff frequency lower than half the sampling frequency $f_s$, according to criteria known to the experts in the field. The output signal $V_{out}$ of the high-pass filter 10 enters a PCM converter 11 comprising a quantizer 12, known to the expert in the field, which produces an output signal $V_Q$ in steps, forced to assume values in a discrete series, a sampler 14, which receives the output signal $V_Q$ of the quantizer and samples it at a desired frequency $f_s$, typically 8 kHz, to generate a quantized sampled signal $V_{QS}$, and an encoder 16, which encodes the signal $V_{QS}$ in PCM pulses.

PCM encoders typically operate by successive comparisons of the sample of signal with gradually more proximate references, and in general at the end of the conversion there is available, on an adder node of the circuit, the residual difference, or remainder, between the sample and the reference. An example of PCM encoder of this type is described for example in the article "A Segmented μ-255 Law PCM Voice Encoder Utilizing NMOS Technology", by Yannis P. Tsividis et al., in *IEEE J. Solid-State Circuits*, vol. SC-11, pp. 740–747, Dec. 1976.

Figure 3:
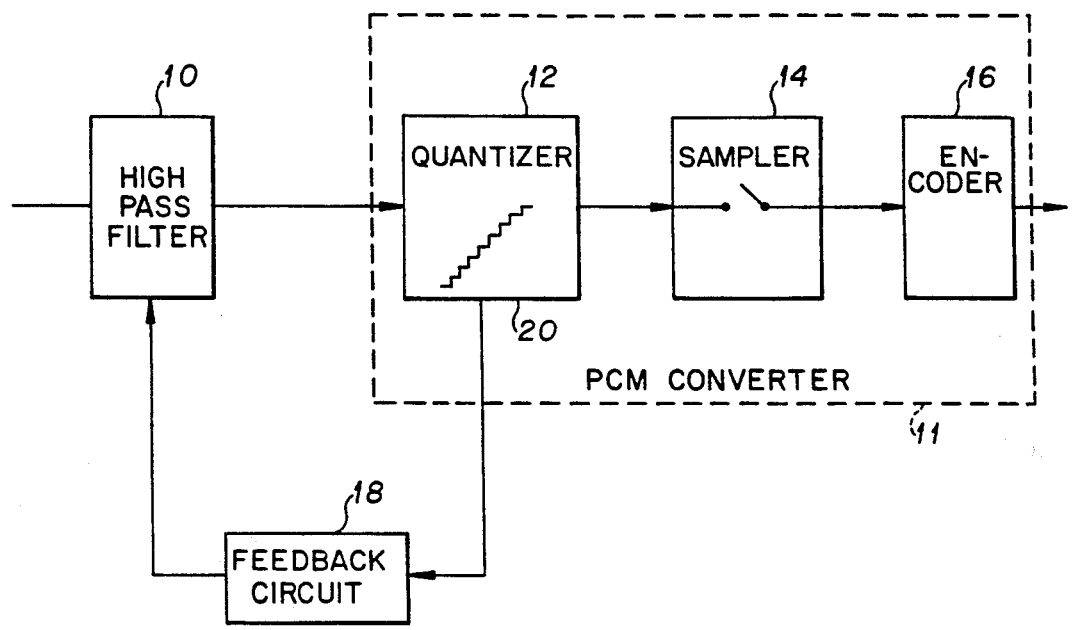
FIG. 3 is a block diagram of a preferred embodiment of PCM conversion circuit according to the invention.

According to the invention, as illustrated in FIG. 3, the PCM conversion circuit comprises, besides the circuits 10, 12, 14 and 16 of FIG. 2, a remainder feedback circuit 18, connected to receive said residual difference from the adder node 20 of the PCM converter and inject it, with or without further processing such as appropriate filtering, in a stage of the high-pass filter 10 such that the overall transfer function from the input of the remainder feedback circuit 18 to the output of the high-pass filter 10 is equivalent to a low-pass filtering.

Figure 4:
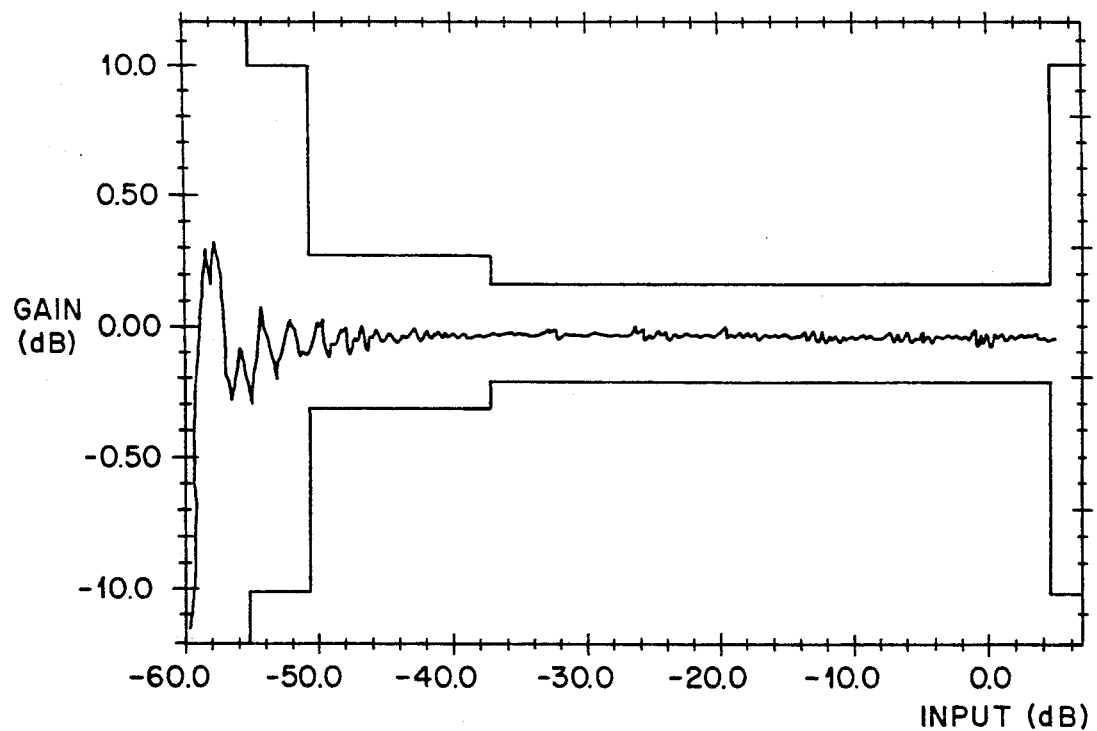
FIG. 4 is a diagram illustrating the gain-tracking obtained with the circuit of FIG. 3.

With the circuit arrangement described above with reference to FIG. 3, a gain-tracking as illustrated in FIG. 4 is obtained, having the same meaning of FIG. 1. As is apparent, the gain-tracking is improved with respect to the one considered ideal illustrated in FIG. 1.

Though the inventors do not have a full understanding of the theoretical reasons for this result, the feedback of the remainder seems to have the effect of distributing more uniformly the quantization error, eliminating the error peaks which occur at the transitions of the signal from a discrete quantization level to another.

Figure 5:
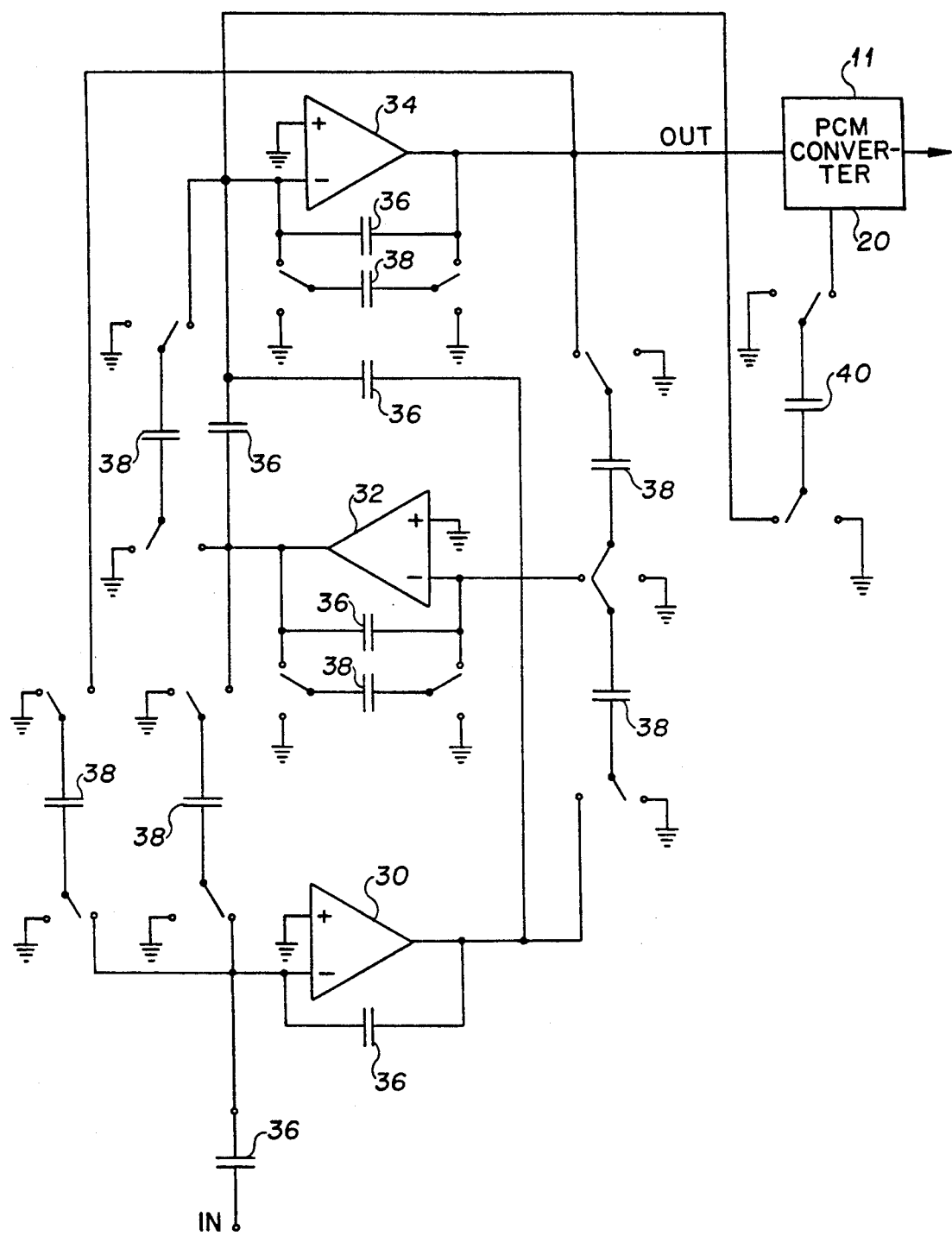
FIG. 5 is an example of practical execution of the conversion circuit of FIG. 3.

FIG. 5 illustrates a more specific example of the invention. The high-pass filter 10 of FIG. 3 has an input terminal IN and an output terminal OUT, and is provided with three operational amplifiers stage 30, 32 and 34, interconnected in a known manner with coupling and integration capacitors 36, and with switched capacitors 38. The remainder feedback circuit 18 is provided as a simple switched capacitor 40, which alternately charges from the adder node 20 of the PCM converter 11 and discharges onto the input of the third operational amplifier 34 of the filter 10. It can be seen that the transfer function from the adder node 20 to the OUT terminal of the filter corresponds to a low-pass filtering.

The remainder feedback circuit 18, instead of being provided with a simple switched capacitor, may also be a complex network, such as to impart to the signal a different filtering, and the feedback of the remainder may be executed in another stage of the filter, for example at the input.

Preferred embodiments of the invention have been described, but it is understood that they are susceptible to modifications and variations on the part of the expert in the field, according to the given teachings, without thereby abandoning the scope of the invention.

We claim:

1. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input connected to said second circuit means to feed back the difference signal to a stage of said filter wherein the overall transfer function from the input of said feedback circuit means to the output of said filter is equivalent to a low pass filtering.

2. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input connected to said second circuit means to feed back the difference signal to a stage of said filter wherein the overall transfer function from the input of said feedback circuit means to the output of said filter is equivalent to a low-passfiltering, and wherein said filter comprises multiple stages and said feedback circuit means is coupled to a later stage thereof.

3. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input connected to said second circuit means to feed back the difference signal to a stage of said filter wherein the overall transfer function from the input of said feedback circuit means to the output of said filter is equivalent to a low-pass filtering, and wherein said filter comprises multiple stages and said feedback circuit means is coupled at an input stage thereof.

4. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input connected to said second circuit means to feed back the difference signal to a stage of said filter wherein the overall transfer function from the input of said feedback circuit means to the output of said filter is equivalent to a low-pass filtering, and wherein said feedback circuit means includes a switched capacitor.

5. Apparatus for the PCM conversion of an analog signal, comprising:
 a filter having an input and an output, the filter receiving at said input said analog signal,
 a quantizer driven by said filter, the quantizer including first circuit means for generating a quantized signal according to the received analog signal and second circuit means for generating a difference signal indicative of the difference between said quantized signal and the analog signal,
 a sampler receiving the quantized signal for sampling the quantized signal at a desired frequency,
 a PCM encoder driven by said sampler, and
 a feedback circuit means having an input connected to said second circuit means to feed back the difference signal from said quantizer to a stage of said filter wherein the overall transfer function from the input of said feedback circuit means to the output of said filter is equivalent to a low pass filtering.

6. Apparatus for the PCM conversion of an analog signal, comprising:
 a filter having an input and an output, the filter receiving at said input said analog signal,
 a quantizer driven by said filter, the quantizer including first circuit means for generating a quantized signal according to the received analog signal and second circuit means for generating a difference signal indicative of the difference between said quantized signal and the analog signal,
 a sampler receiving the quantized signal for sampling the quantized signal at a desired frequency,
 a PCM encoder driven by said sampler, and
 feedback circuit means having an input connected to said second circuit means to feed back the difference signal from said quantizer to a stage of said filter wherein the overall transfer function from the input of said feedback circuit means to the output of said filter is equivalent to a low pass filtering, and wherein said filter comprises multiple stages and said feedback circuit means is coupled to a later stage thereof.

7. Apparatus for the PCM conversion of an analog signal, comprising:
 a filter having an input and an output, the filter receiving at said input said analog signal,
 a quantizer driven by said filter, the quantizer including first circuit means for generating quantized signal according to the received analog signal and second circuit means for generating a difference signal indicative of the difference between said quantized signal and the analog signal, a sampler receiving the quantized signal for sampling the quantized signal at a desired frequency, a PCM encoder driven by said sampler, and feedback circuit means having an input connected to said second circuit means to feed back the difference signal from said quantizer to a stage of said filter wherein the overall transfer function from the input of said feedback circuit means to the output of said filter is equivalent to a low pass filtering, and wherein said filter comprises multiple stages and said feedback circuit means is coupled at an input stage thereof.

8. Apparatus for the PCM conversion of an analog signal, comprising:

a filter having an input and an output, the filter receiving at said input said analog signal, a quantizer driven by said filter, the quantizer including first circuit means for generating a quantized signal according to the received analog signal and second circuit means for generating a difference signal indicative of the difference between said quantized signal and the analog signal, a sampler receiving the quantized signal for sampling the quantized signal at a desired frequency, a PCM encoder driven by said sampler, and feedback circuit means having an input connected to said second circuit means to feed back the difference signal from said quantizer to a stage of said filter wherein the overall transfer function from the input of said feedback circuit means to the output of said filter is equivalent to a low pass filtering, and wherein said feedback circuit means includes a switched capacitor.

9. Apparatus as set forth in claim 5 wherein said sampler samples at a sampling rate of approximately 8 kHz.

10. Apparatus for the PCM conversion of an analog signal, comprising:

a filter having an input and an output, the filter receiving at said input said analog signal, a quantizer driven by said filter, the quantizer including first circuit means for generating a quantized signal according to the received analog signal and second circuit means for generating a difference signal indicative of the difference between said quantized signal and the analog signal;

a sampler recieving the quantized signal for sampling the quantized signal at a desired frequency, a PCM encoder driven by said sampler, and feedback circuit means having an input connected to said second circuit means to feed back the difference signal from said quantizer to a stage of said filter wherein the overall transfer function from the input of said feedbck circuit means to the output of said filter is equivalent to a low pass filtering, and wherein said filter comprises a high pass filter.

11. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input connected to said second circuit means to feed back the difference signal to a stage of said filter wherein the overall transfer function from the input of said feedback circuit means to the output of said filter is equivalent to a low-pass filtering, and wherein said filter comprises a high pass filter.

12. In a system for the PCM conversion of an analog signal including a filter having an input at which the analog signal is applied, and a PCM converter circuit coupled from said filter and providing a quantized signal, said converter circuit including first circuit means for generating a quantized signal according to the received analog signal and second circuit means for generating a difference signal according to the difference between said quantized signal and the analog signal, the improvement comprising, feedback circuit means having an input and an output, said feedback circuit means input coupled from said second circuit means for receiving said difference signal, said feedback circuit means output coupled to a stage of said filter, said feedback circuit means for feeding back the difference signal from said second circuit means to a stage of the filter, wherein the overall transfer function from the input of said feedback circuit means to the output of said filter is equivalent to a low pass filtering.

13. In a system as set forth in claim 1, wherein said PCM converter circuit has a sampling rate substantially twice the band width of the analog signal.

14. Apparatus as set forth in claim 5, wherein said desired frequency is substantially twice the band width of the analog signal, 15. Apparatus as set forth in claim 12, wherein said PCM converter circuit has a sampling rate substantially twice the band width of the analog signal.

16. A circuit for encoding an input signal comprising:

a high pass filter having an input for receiving the input signal and an output;

a quantizer having an input connected to the high pass filter output for providing a quantized output and a quantizer error signal;

a sampler having an input connected to the quantizer output for providing a sampled output;

an encoder having an input connected to the sampler output for providing the encoded signal; and a feedback circuit connected to receive the quantizer error signal and to inject the quantizer error signal into the high pass filter;

wherein the overall transfer function from the quantizer error signal output of the quantizer to the output of the high pass filter has a low pass characteristic.

17. A circuit for encoding an input signal comprising:

a high pass filter having an input for receiving the input signal and an output, and comprising first, second and third operational amplifiers each having an input and an output and interconnected with coupling and integration capacitors and switched capacitors;

a PCM converter for providing a PCM encoded output of the output of the high-pass filter and having an adder node providing a quantizer error signal;

a remainder feedback circuit comprising a switched capacitor which alternately charges from the adder node of the PCM converter and discharges into the input of one of the operational amplifiers of the high-pass filter;

wherein the transfer function from the adder node to the output of the high-pass filter has a low pass characteristic.

18. The circuit of claim 17 wherein the input of the first operational amplifier receives the input signal and the output of the first operational amplifier is connected to the input of the second operational amplifier, and wherein the output of the second operational amplifier is connected to the input of the third operational amplifier via a coupling capacitor, and wherein the output of the third operational amplifier provides the output of the high pass filter, and
  wherein each of the operational amplifiers has an integration capacitor coupling its input to its output.

19. The circuit of claim 17 wherein the output of the third operational amplifier provides the output of the high pass filter and wherein the remainder feedback circuit is connected between the adder node of the PCM converter and the input of the third operational amplifier of the high pass filter.

20. The circuit of claim 17 wherein the output of the third operational amplifier provides the output of the high pass filter and wherein the remainder feedback circuit is connected between the adder node of the PCM converter and the input of the first operational amplifier of the high pass filter.

* * * * *

UNITED STATES PATENT AND TRADEMARK OFFICE
CERTIFICATE OF CORRECTION

PATENT NO. : 5,287,106

DATED : February 15, 1994

INVENTOR(S) : Daniel Senderowicz, Germano Nicollini, Carlo Crippa and Pierangelo Confalonieri It is certified that error appears in the above-identified patent and that said Letters Patent is hereby corrected as shown below:

On the title page, item
[73] Assignee: change "SGS-Thomson Microelectronics spa, Catania, Italy" to -- SGS-Thomson Microelectronics S.r.l., Agrate Brianza, Italy --.

Signed and Sealed this

Sixteenth Day of May, 1995

*Attest:*

BRUCE LEHMAN

*Attesting Officer*      *Commissioner of Patents and Trademarks*